United States Patent [19]

Miyajima

[11] Patent Number: 4,644,313
[45] Date of Patent: Feb. 17, 1987

[54] CYLINDRICAL MAGNET APPARATUS
[75] Inventor: Goh Miyajima, Katsuta, Japan
[73] Assignee: Hitachi, Ltd., Tokyo, Japan
[21] Appl. No.: 719,889
[22] Filed: Apr. 4, 1985
[30] Foreign Application Priority Data Apr. 4, 1984 [JP] Japan .................................. 59-65758

[51] Int. Cl.$^4$ .............................................. H01F 7/00
[52] U.S. Cl. .................................... 335/296; 335/304; 324/318
[58] Field of Search ............... 324/318, 319, 320, 321; 335/296, 297, 302, 306, 301, 214, 300

[56] References Cited

U.S. PATENT DOCUMENTS 3,205,415  9/1965  Seki et al. ...................... 335/301 X
3,493,904  2/1970  Favereau ........................ 335/299 X
4,276,529  6/1981  Heinzerling et al. ............... 335/300

Primary Examiner—George Harris
Attorney, Agent, or Firm—Antonelli, Terry & Wands

[57] ABSTRACT

A cylindrical permanent magnet apparatus and electromagnet apparatus used with a nuclear magnetic resonance imaging system are disclosed, in which a magnetic path of ferromagnetic material is arranged around a predetermined Z axis, magnetic field source are arranged at the ends of the magnetic path, a cylindrical magnetic flux conductor is interposed between the magnetic field sources, and an object to be inspected is adapted to be inserted in the cylindrical magnetic flux conductor. A cylindrical magnet apparatus comparatively light in weight which has a homogeneous magnetic field and has magnetic shielding effect and is suitable for routine applications is thus provided.

17 Claims, 18 Drawing Figures

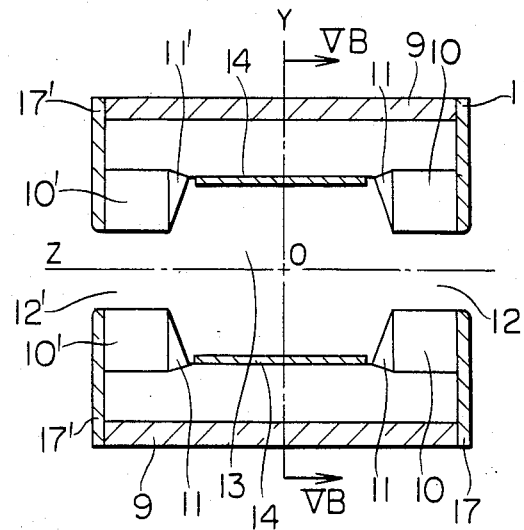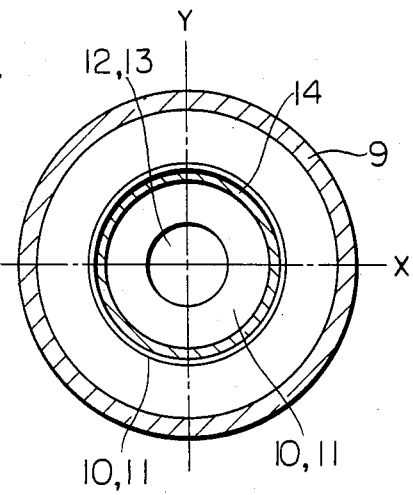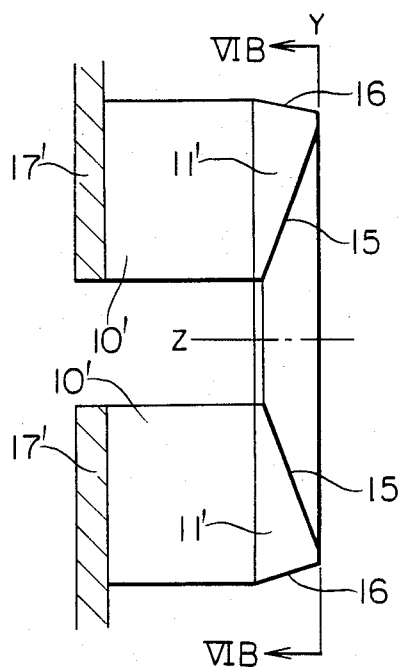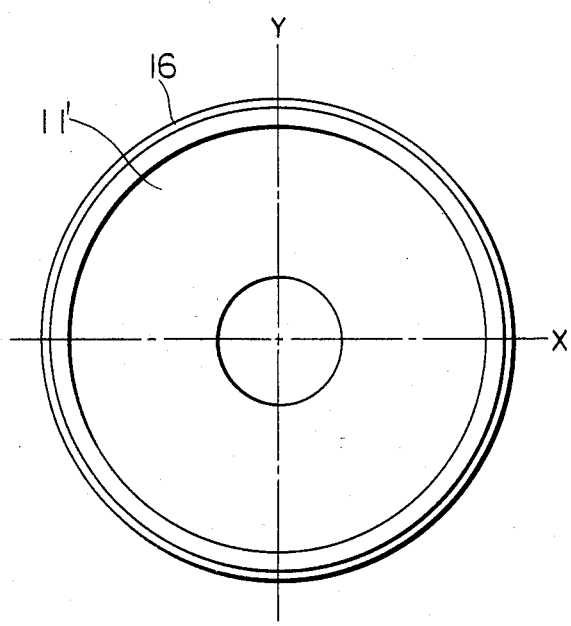

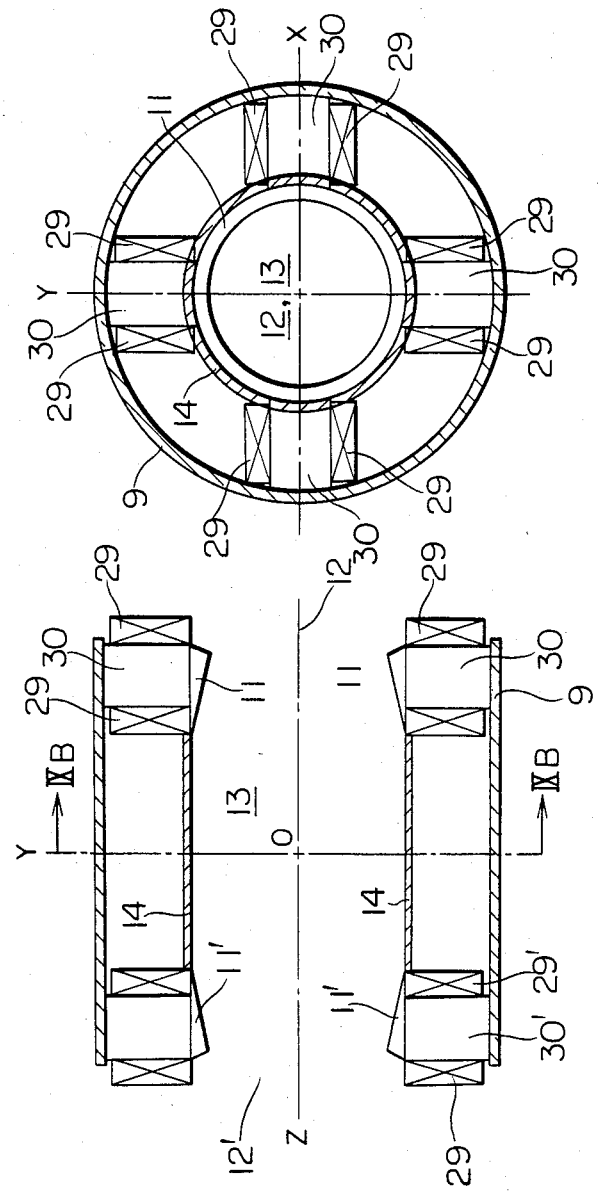

CYLINDRICAL MAGNET APPARATUS

BACKGROUND OF THE INVENTION

The present invention relates to a cylindrical magnet apparatus, and more in particular to a cylindrical permanent magnet or an electromagnet apparatus suitable for use with a nuclear magnetic resonance (NMR) imaging apparatus (hereinafter called "MRI").

A magnetic field generating apparatus (hereinafter called "the magnet") used with an NMR imaging apparatus has a magnetic field generating space accommodating therein a compensating coil for improving the magnetic field homogeneity, a gradient coil (GC) for generating a gradient magnetic field in X, Y and Z directions, an NMR irradiation coil and a detection coil in which a human body or a human head is inserted, and a part of table for holding the human body.

FIGS. 1A and 1B show an embodiment of a generally-used conventional permanent magnet apparatus of so called "WE-type", in which FIG. 1A specifically shows a side view along the plane Y-Z, and FIG. 1B a sectional view along X-Y plane taken in line IB—IB in FIG. 1A. Numeral 2 designates permanent magnet members constituting a magnetic field source, numeral 3 pole pieces for making uniform the magnetic fluxes generated from the permanent magnet members 2, and numeral 4 a magnetic field generating space into which the magnetic fluxes thus made uniform flow. A magnetic yoke 1 made of a ferromagnetic material (generally iron) is so constructed as to confine the magnetic fluxes in the magnet system.

The gap size between the oppositely-placed pole pieces 3 is designated as g, and the surface diameter of the pole pieces 3 as D. FIGS. 2A and 2B show an embodiment of a conventional air-core four-coil resistive electromagnet (hereinafter called "RM") most widely used for routine MRI, in which FIG. 2A is a side view along the Y-Z plane, and FIG. 2B a sectional view of the X-Y plane as viewed in line IIB—IIB in FIG. 2A. In FIGS. 2A and 2B, numerals 5, 6 designate electromagnet coils wound with an anodized aluminum strip, respectively. Numeral 8 designates an opening of the electromagnet coil, and numeral 7 is a space in which a magnetic field is generated when current flows through the electromagnet coils 5, 6.

In the WE-type permanent magnetic apparatus shown in the drawing, the gap size g of the magnetic field space 4 is at least 70 cm, and RM shown in FIG. 2 requires a magnetic field-generating space 7 of 90 cm in minimum inner diameter and a magnet opening of 60 cm in minimum inner diameter for accommodating the human body. The magnetic field-generating space, is required not only to generate a magnetic field but also to secure a homogeneous magnetic field of at least 150 ppm (parts per million) in 40 cm dsv (diameter of spherical volume) and 50 ppm in 30 cm dsv. This makes the magnet now used with MRI extremely large in size. Typical examples of the magnets now available on the market are as follows:

(i) In generating a magnetic field of 0.15 T (tesla) by RM the above-mentioned homogeneity of magnetic field is obtained when the magnet opening is 80 cm in diameter, and the inner diameter of the magnetic field-generating space is 100 cm in diameter, requiring the weight of about three tons, electric power of about 50 KVA, AC and the cooling water of about 50 l/min.

(ii) In generating a given magnetic field of 0.5 to 2.0 T (tesla) by a super conductive magnet (SCM), the inner diameter of about 100 cm, the weight of about 4.5 tons, the quantity of liquid helium (He) of about 800 l and the quantity of liquid nitrogen ($N_2$) of about 500 l are required, while consuming great quantities of refrigerants including liquid He at the rate of 0.5 l/hr and liquid $N_2$ at the rate of 2 l/hr.

(iii) In general, the permanent magnet apparatus, does not necessitate electric power, cooling water or refrigerant, while the WE-type permanent magnet apparatus requires the weight of about 10 tons for the magnetic field of 0.05 T (tesla) and about 100 tons for 0.3 T (tesla).

MRI, which is used for clinical diagnosis in hospitals, is desirably a safe and stable system including a simple equipment provided with a power supply, and cooling water, refrigerant and air-conditioning systems, easy in maintenance and control, and low in maintenance, operation and other costs. For routine MRI, therefore, the permanent magnet apparatus is the best choice as a magnet.

As described above, the WE-type permanent magnet apparatus, if built by the prior art, is excessively heavy making transportation and carriage into a building and installation therein very troublesome. The weight of about ten tons do not provide a large problem, but the associated magnetic field of 0.05 T (tesla) fails to meet the current and future requirements. Even for routine MRI, the magnetic field of at least 0.1 to 0.15 T (tesla) is necessary. If this intensity of magnetic field is to be obtained by the prior art, the weight of as much as 30 to 50 tons will be required.

The reasons for the requirement of this great weight will be discussed below.

In MRI, a homogeneous magnetic field is required over a wide area of the magnetic field-generating space as mentioned above. In the conventional WE-type permanent magnet apparatus, the homogeneity of magnetic field ($\Delta H_0/H_0$) is given as $$\Delta H_0/H_0 \sim 10^{-(D/g+1)} \quad (1)$$

where
 $\Delta H_0$: Magnetic field irregularities
 $H_0$: Central magnetic field
 g: Gap size
 D: Diameter of pole piece (in disc form)

In order to improve the uniformity of magnetic field, therefore, it is necessary to reduce the gap size g and to increase the diameter D. For NMR imaging, however, the gap size g of at least 70 cm is required, and therefore, if $\Delta H_0/H_0 \sim 10^{-5}$ is required for 30 cm dsv, the diameter D may be 280 cm (=70 cm×4). The diameter D of at least 200 cm is required even with various auxiliary means for correcting the homogeneity. As obvious from FIG. 1, with the increase in diameter D, the permanent magnet members 2, increase in size, thereby increasing the magnetic yokes 1, very greatly. As a result, the weight of approximately 100 tons is involved for 3000 gauss.

SUMMARY OF THE INVENTION

The primary object of the present invention is to provide a cylindrical magnet apparatus which is comparatively light in weight and high in magnetic field homogeneity, comprising a cylindrical magnetic yoke of a ferromagnetic material arranged around a predetermined axis, magnetic field sources made of magnets disposed at the ends of the cylindrical magnetic yoke, and a flux guide interposed between the magnetic field sources.

Another object of the present invention is to provide a cylindrical magnet apparatus comprising a cylindrical magnetic yoke of ferromagnetic material, permanent magnet generating magnetic fluxes, a magnetic field-generating space passed through the central axis (Z axis) of the cylindrical yoke, a comparatively thin cylindrical magnetic flux guide made of a ferromagnetic material interposed between the permanent magnet members whereby the magnetic fluxes flowing between the permanent magnet members are effectively confined inside the cylindrical flux guide and made homogeneous, while magnetically saturating the magnetic flux guide and maintaining the interior thereof at high magnetic flux density thereby holding a high magnetic field and high homogeneity at the central area of the magnetic field-generating space.

Still another object of the present invention is to provide a cylindrical magnet apparatus comprising a cylindrical magnetic yoke of ferromagnetic material, coils arranged at the ends of the cylindrical magnetic yoke for generating magnetic fluxes, a magnetic field-generating space passed through the central axis of the cylindrical yoke (Z axis), and a comparatively thin cylindrical flux guide made of ferromagnetic material interposed between the coils whereby the magnetic fluxes generated between the energized end coils are confined inside the cylindrical flux guide and are made homogeneous, the magnetic flux guide is magnetically saturated with the interior thereof maintained at high magnetic flux density, thereby holding a high magnetic field and high homogeneity at the central area of the magnetic field-generating space.

BRIEF DESCRIPTION OF THE DRAWINGS

FIG. 5A is a view of a cylindrical permanent magnet apparatus according to a second embodiment of the present invention.

FIG. 5B is a sectional view taken in line VB—VB in FIG. 5A.

FIG. 6A is an enlarged view of a pole piece of the cylindrical permanent magnet shown in FIG. 5A.

FIG. 6B is a view taken in line VIB—VIB in FIG. 6A.

FIG. 9A is a view of a cylindrical electromagnetic apparatus according to a fifth embodiment of the present invention.

FIG. 9B is a sectional view taken in line IXB—IXB in FIG. 9A.

DESCRIPTION OF THE PREFERRED EMBODIMENTS

Figure 3A:
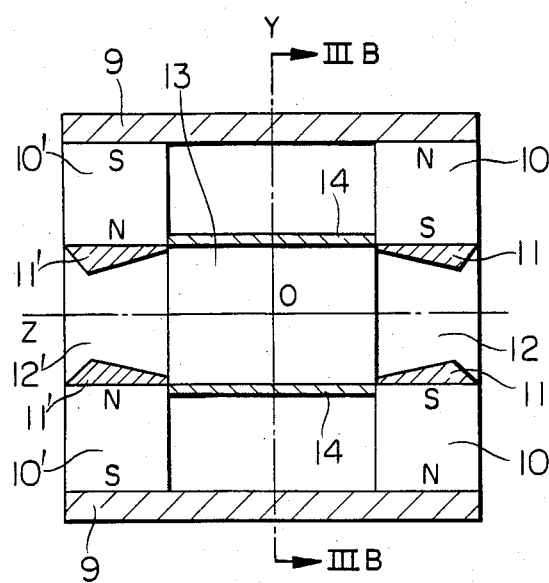
FIG. 3A is a view of a cylindrical permanent magnetic apparatus according to a first embodiment of the present invention.
Figure 3B:
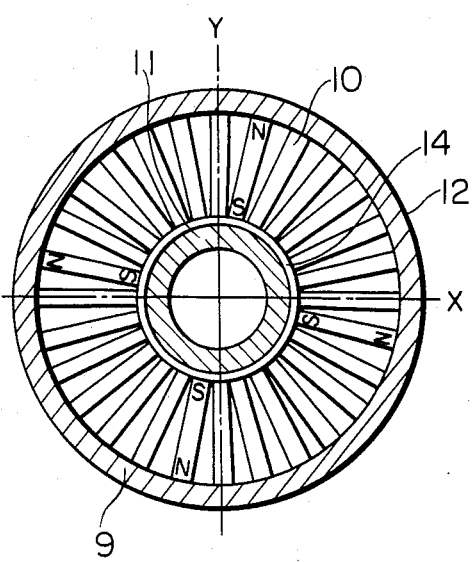
FIG. 3B is a sectional view taken in line IIIB—IIIB in FIG. 3A.

FIGS. 3A and 3B are diagrams showing a cylindrical permanent magnet apparatus according to a first embodiment of the present invention, in which FIG. 3A specifically shows a view along the Y-Z plane, and FIG. 3B a sectional view taken along X-Y plane as viewed in line IIIB—IIIB in FIG. 3A.

Permanent magnet members 10, 10' are disposed at the ends of a cylindrical magnetic yoke 9 of a ferromagnetic material (generally, iron) as magnetic field sources. The permanent magnet members 10, 10' are made of ceramic or ferrite magnets for its low cost. In the case where a magnetic field of higher intensity is required, a rare earth magnet may be used in series with the ferrite magnet or independently, though high in cost.

The permanent magnet members 10, 10' are magnetized oppositely to each other in the directions substantially perpendicular to the Z axis.

The magnet apparatus includes a magnetic field generating space 13 and magnet openings 12, 12' through the central axis of the cylindrical magnetic yoke, thereby permitting insertion of an object to be inspected.

Further, there are provided ferromagnetic pole pieces 11, 11', on the inside surfaces of the permanent magnet members 10, 10', the high magnetic permeability of which is used for making the magnetic fluxes uniform.

In FIG. 3B, the permanent magnet members 10, 10' are tabular in shape and magnetized in such a manner that the permanent magnet member 10 has an N pole on the side thereof in contact with the cylindrical magnetic yoke 9 and an S pole on the side thereof in contact with the pole piece 11. The permanent magnet member 10', on the other hand, is magnetized in opposite polarities. The tabular permanent magnet members 10, 10' are arranged in a direction perpendicular to the cylindrical magnetic yoke 9 and directed toward the center of the cylindrical pole piece 11.

Figure 4A:
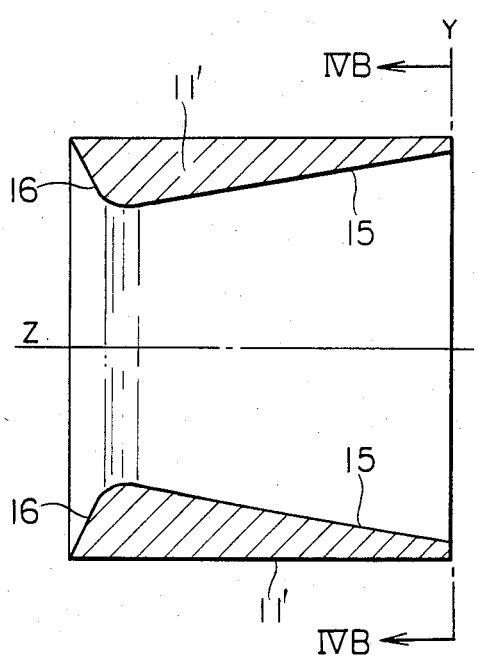
FIG. 4A is a diagram showing an enlarged view of a pole piece of a cylindrical permanent magnet apparatus in FIG. 3A.
Figure 4B:
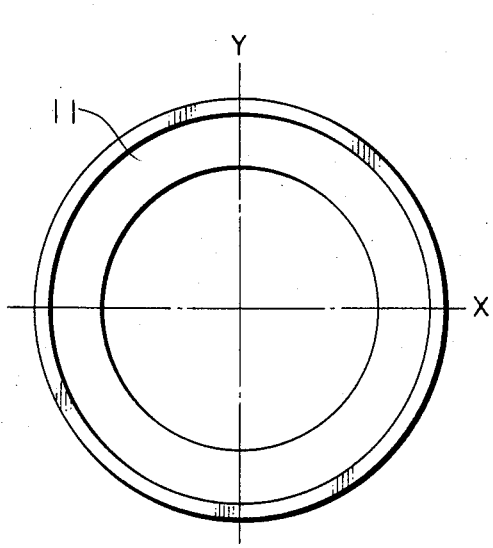
FIG. 4B is a view as taken in line IVB—IVB in FIG. 4A.

FIGS. 4A and 4B are enlarged views of a pole piece of the cylindrical permanent magnet apparatus shown in FIG. 3, in which FIG. 4A specifically shows a view along the Y-Z plane, and FIG. 4B is a view taken in the X-Y plane as viewed in line IVB—IVB in FIG. 4A.

Figure 1A:
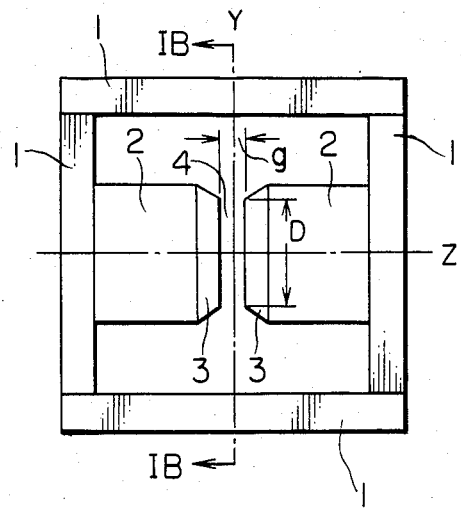
FIG. 1A is a side view of a conventional WE-type permanent magnet apparatus.
Figure 1B:
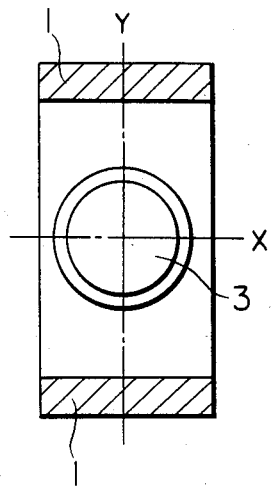
FIG. 1B is a sectional view taken in line IB—IB in FIG. 1A.
Figure 2A:
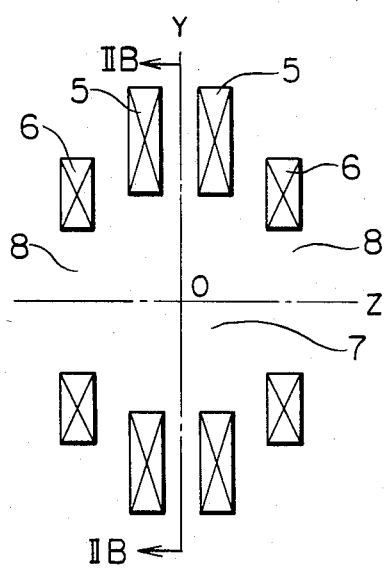
FIG. 2A is a side view of RM.
Figure 2B:
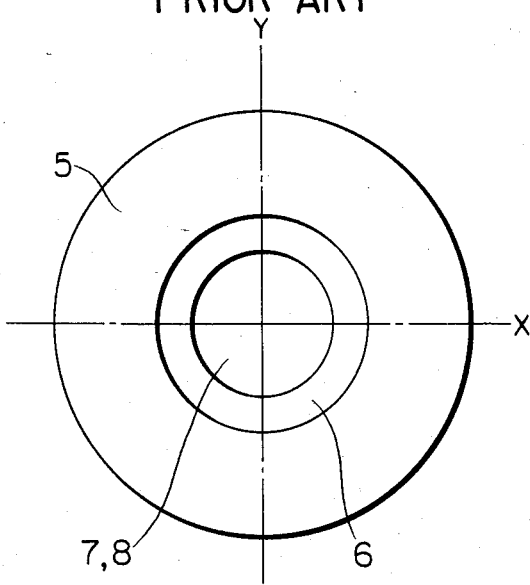
FIG. 2B is a sectional view taken in line IIB—IIB in FIG. 2A.

Magnetic fluxes flow toward the magnetic field generating space 13 by utilizing the gradient of the inner surface 15 of the pole piece 11'. The outer end surfaces 16 of the pole piece 11', through which the magnetic fluxes flow, functions to converge the magnetic fluxes leaking through the magnet openings 12, 12' from the magnetic field generating space 13 and prevent the deterioration of the homogeneity of the magnetic field in the Z direction in the magnetic field generating space 13. The magnetic fluxes leaking outside, unlike in the case of RM without any cylindrical magnetic yoke of ferromagnetic material shown in FIG. 2, return to the cylindrical magnetic yoke 9 through a very short space path. The magnetic fluxes flowed from the inner surface 15 of the pole piece 11 toward the magnetic field generating space 13 would return to the cylindrical magnetic yoke 9 after being diffused in the wide space defined by the cylindrical magnetic yoke 9 as well as in the space in the magnetic field generating space 13 if the magnetic flux guide 14 is lacking. In such a case, the magnetic field intensity and homogeneity in the magnetic field generating space 13 is clearly deteriorated greatly.

The magnetic flux guide 14 is comparatively thin and is magnetically saturated by a part of the magnetic fluxes to maintain a high magnetic flux density, for example, 2.1 tesla for iron, 0.8 tesla for iron powder molds, and 0.25 tesla for rubber with soft ferrite. In such case, most of the magnetic fluxes are confined inside the magnetic flux guide 14, so that the inside of the magnetic flux guide 14 may be considered to make up the magnetic field generating space 13. For the purpose of NMR imaging, the inner diameter of the magnetic flux guide 14 is sufficient if it is from 90 cm to 100 cm in diameter with the length of 90 to 100 cm.

When the permanent magnet members 10, 10' are made of ceramic or ferrite, the total weight is about 12 tons for $H_0$ of 0.12 tesla. This weight .anc be reduced to less than 10 tons if a rare earth magnet is used.

The magnetic flux guide 14 is preferably made of a high-frequency soft ferrite material for radio frequency or a molding material of ferromagnetic powder in order to prevent an eddy current from being generated in the flux guide if alternating magnetic fields exist therein.

FIGS. 5A and 5B show a cylindrical permanent magnet apparatus according to a second embodiment of the present invention, in which FIG. 5A specifically shows a view along the Y-Z plane, and FIG. 5B a sectional view along the X-Y plane taken in line VB—VB in FIG. 5A.

Magnetic field sources made up of the permanent magnet members 10, 10' are disposed on annular magnetic yokes 17, 17' of ferromagnetic material (generally, iron) supported by the cylindrical magnetic yoke 9 of ferromagnetic material (generally, iron). The permanent magnet members 10, 10' are magnetized in the same direction substantially in parallel to the Z axis.

The magnet apparatus includes magnet openings 12, 12' and a magnetic field generating space 13 through the central axis of the cylindrical magnetic yoke, thereby permitting insertion of an object to be inspected along the Z axis.

Further, the apparatus is constructed so as to reduce the magnetic field leakage. Specifically, the annular magnetic yokes 17, 17' cause the permanent magnet members 10, 10' to be located within a closed magnetic loop so that the annular magnetic yokes 17, 17' high in magnetic permeability are in contact with the exterior of the magnet, thus clearly reducing the magnetic field leakage.

FIGS. 6A and 6B are enlarged views of a pole piece of the cylindrical permanent magnet shown in FIG. 5A, in which FIG. 6A specifically shows a view along the Y-Z plane, and FIG. 6B a view taken in line VIB—VIB in FIG. 6A.

As shown in FIG. 6A, pole pieces 11, 11' made of ferromagnetic material (generally iron) are disposed on the opposite end surfaces to each other of the permanent magnet members 10, 10', so that the magnetic fluxes generated are uniformed by the high magnetic permeability of the ferromagnetic materials. The magnetic fluxes flow toward the magnetic field generating space 13 by use of the gradient of the inner surface 15 of the pole piece 11'. The magnetic fluxes that have leaked out of the magnet openings 12, 12', unlike in the case of RM having no cylindrical magnetic yoke of ferromagnetic material, return through a very short space to the annular magnetic yokes 17, 17', and cylindrical magnetic yokes 9, 9'. The magnetic fluxes flowed from the inner surface 15 of the pole piece 11 toward the magnetic field generating space 13, if there is no magnetic flux guide 14 provided, returns to the cylindrical magnetic yoke 9 after being diffused in the wide space defined by the cylindrical magnetic yoke 9 as well as through the space in the magnetic field generating space 13. In this case, the intensity and homogeneity of the magnetic field in the magnetic field generating space 13 is greatly reduced.

A magnetic flux guide 14 made of a ferromagnetic material is thus newly introduced. The magnetic flux guide 14 which is comparatively thin, is magnetically saturated by a part of the magnetic fluxes and maintained at high magnetic flux density. The magnetic flux density of 2.1 tesla, for example, is involved for iron, 0.8 tesla for iron powder molded product, and 0.25 tesla for rubber with soft ferrite. In those cases, most of the magnetic fluxes are confined inside the magnetic flux guide 14 so that the magnetic field generating space 13 may be considered to exist in the magnetic flux guide 14. For the purpose of NMR imaging, the magnetic flux guide 14 with the inner diameter of 90 cm to 100 cm and the length of 90 to 100 cm is sufficient.

If ferrite magnets are used for the permanent magnet members 10, 10', the total weight of about 12 tons is involved for H of 0.12 tesla, while the weight can be reduced below 10 tons for the rare earth magnet.

Figure 7A:
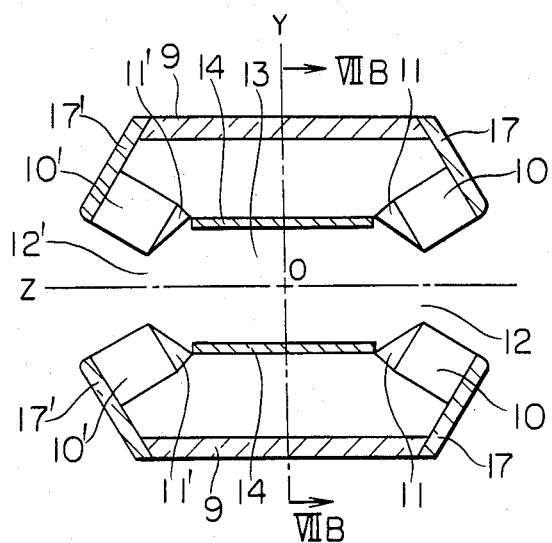
FIG. 7A is a view of a cylindrical permanent magnetic apparatus according to a third embodiment of the present invention.
Figure 7B:
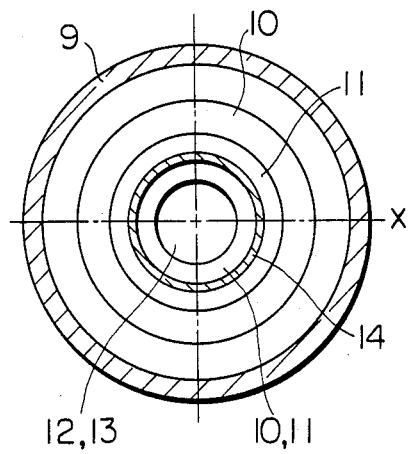
FIG. 7B is a sectional view taken in line VIIB—VIIB in FIG. 7A.

FIGS. 7A and 7B are diagrams showing a cylindrical permanent magnet apparatus according to a third embodiment of the present invention, in which FIG. 7A specifically shows a view along the Y-Z plane, and FIG. 7B a sectional view taken in line VIIB—VIIB in FIG. 7A.

In FIG. 7A, the angle at which the cylindrical magnetic yoke of ferromagnetic material 9 is connected with annular magnetic yokes 17, 17' is made greater than the right angle, so that the inner diameter of the magnetic flux guide 14 is reduced and therefore the permanent magnet members 10, 10' are not required to be increased in weight. That is, the need of the increasing of the weight of the magnet is not required.

Figure 8A:
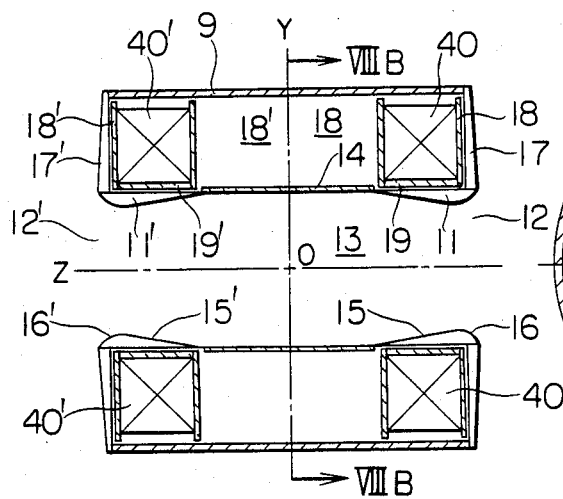
FIG. 8A is a view of a cylindrical electromagnet according to a fourth embodiment of the present invention.
Figure 8B:
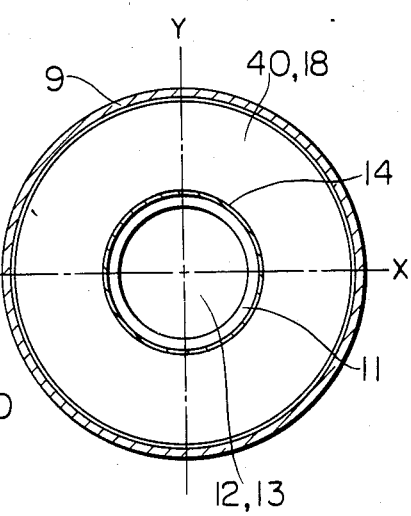
FIG. 8B is a sectional view taken in line VIIIB—VIIIB in FIG. 8A.

FIGS. 8A and 8B are diagrams showing a cylindrical electromagnet apparatus according to a fourth embodiment of the present invention, in which FIG. 8A specifically shows a view along the Y-Z plane, and FIG. 8B a sectional view taken in line VIIIB—VIIIB in FIG. 8A.

Coils 40, 40' making up magnetic flux sources are wound with aluminum strip electrically insulated by anodization. When DC current is applied through the coils 40, 40', magnetic fluxes flow in the magnetic field generating space 13 through pole pieces 11, 11' thereby to generate a magnetic field. The coils 40 and 40' are wound in the same direction. When the DC current is applied in the same direction through the coils, the direction of the magnetic field is determined by Ampere's Law. The magnetic fluxes, when directed from one coil 40 to the other coil 40', for instance, flow through the cylindrical pole piece 11 and the magnetic field generating space 13 into the cylindrical pole piece 11', then through the annular magnetic yoke 17', the cylindrical magnetic yoke 9 and the annular magnetic yoke 17 turn to the pole piece 11. In the magnetic flux flow circuit thus formed, the magnetic yoke 9, pole pieces 11, 11' and the annular magnetic yokes 17, 17' are all made of a ferromagnetic material (generally iron). These component parts have a sufficiently large sectional area of the magnetic flow circuit not to be magnetically saturated, and their magnetic flux density is generally 1.0 to 1.5 T (tesla) for the iron cylindrical and annular magnetic yokes. In this case, the magnetic permeability is not smaller than 1000, thus clearly indicating that the magnetic flux leakage from the magnetic circuit of the closed loop mentioned above into the external space is very small in amount.

As shown in FIG. 8A, a magnetic field generating space 13 and magnet openings 12, 12' are provided along the central axis Z of the cylindrical magnetic yoke thereby to permit insertion of an object to be inspected for MRI. The pole pieces 11, 11', for their high magnetic permeability, uniform the magnetic fluxes generated by the coils 40, 40' The magnetic fluxes flowed from the inner surface 15 of the pole piece 11' toward the magnetic field generating space 13, if the magnetic flux guide 14 is not provided, will diffuse in the wide space defined by the cylindrical magnetic yoke 9. In such a case, the intensity and homogeneity of the magnetic field in the magnetic field generating space 13 is reduced apparently.

A magnetic flux guide 14 made of a ferromagnetic material is thus newly introduced. The magnetic flux guide 14, which is comparatively thin, is magnetically saturated and maintained at high magnetic flux density by a part of the magnetic fluxes. The density of magnetic fluxes such as 2.1 tesla is involved for iron, 0.8 tesla for an iron powder molded product and 0.25 tesla for rubber with soft ferrite. In these cases most of the magnetic fluxes are confined in the space in the magnetic flux guide 14, so that the magnetic field generating space 13 may be considered to make up the inside space of the magnetic flux guide 14. For the purpose of MRI, the magnetic flux guide 14 with the inner diameter (D) of 90 cm to 100 cm and the length (L) of 90 to 100 cm is sufficient. The homogeneity of the magnetic field in the magnetic field generating space 13 is improved with the magnetic flux guide 14, thereby attaining a magnetic field homogeneity sufficient for MRI even when $L/D \simeq 1$.

It will be seen from the above that the problems posed by the RM including (i) a high magnetic field intensity impossible to obtain and (ii) the magnetic field leakage over a wide area, are remarkably improved. Specifically, although 0.15 T (tesla) is about the limit for RM, the coils 40, 40' according to the fourth embodiment of the present invention, unlike RM, are free from any restriction in the coil shape, winding size and then accuracy and may be designed as magnetic flux source of very low resistance with small power loss. According to the fourth embodiment of the present invention, it is thus possible to produce a magnetic field ($H_0$) more than double that for RM. The weight of the magnet can also be reduced to less than 10 tons. As regards (ii), unlike RM which makes up a leaking magnetic field, the fourth embodiment of the present invention is such that magnetic fluxes flow in a closed loop and therefore very little magnetic fluxes leak, thereby obviating the problem of the magnetic field interfering with adjacent rooms or upper floor in the building. A coil assembly will be described briefly below.

The coils 40, 40' are wound on cylindrical cores 19, 19' and may be made of glassfiber-reinforced epoxy resin (GFRP) or an aluminum material electrically insulated. Annular discs 18, 18' provide side plates for holding the coils 40, 40' through a silicon compound or the like high in electrical insulation and thermal conductivity. Generally, however, an aluminum material high in thermal conductivity is employed. Embedded in the interior of the side plates is a copper pipe for supplying the cooling water whereby the heat generated by energization of the coils 40, 40' is carried outside with the cooling water. The annular discs 18, 18' and cylindrical cores 19, 19' are fixed on the cylindrical magnetic yoke 9, pole pieces 11, 11' and the annular magnetic yokes 17, 17'. Instead of the aluminum strip used for the coils 40, 40' in the fourth embodiment, a copper strip or copper hollow pipe (with the cooling water supplied therethrough) may be used.

FIGS. 9A and 9B are diagrams showing a cylindrical electromagnet apparatus according to a fifth embodiment of the present invention, which makes up a modification of the fourth embodiment. Specifically, FIG. 9A shows a view along the Y-Z plane, and FIG. 9B is a sectional view taken in line IX—IX in FIG. 9A.

The embodiment under consideration includes a 4-division coil system, instead of which the coil may be divided into a greater number.

Coils 29, 29' are wound around the ferromagnetic poles 30, 30' (generally made of iron), and current is supplied through the coils 29, 29' thereby to generate magnetic fluxes. The magnetic fluxes thus generated flow into the magnetic field generating space 13 after uniformed by the pole pieces 11, 11'. A closed loop is formed with the cylindrical magnetic yoke 9 made of a ferromagnetic material. Numerals 12, 12' designate magnet openings, and numeral 14 a magnetic flux guide. These component elements are identical to those designated with the same numerals in the fourth embodiment.

It will thus be understood from the foregoing description that according to the present invention, there are provided large magnetic shield effect, a cylindrical magnet apparatus comparatively light in weight and high in magnetic field homogeneity which can be used with MRI of permanent magnet type or electromagnet type. Another advantage is that an electromagnet of small power loss can be obtained. Accordingly, an optimum cylindrical magnet apparatus for routine purposes is provided.

I claim:

1. A cylindrical magnet apparatus comprising a cylindrical magnetic yoke of a ferromagnetic material arranged around a predetermined axis (Z axis), magnetic field sources disposed at the ends of the cylindrical magnetic yoke, and a cylindrical magnetic flux guide interposed between said magnetic field sources, wherein an object to be inspected is inserted in said magnetic flux guide.

2. A cylindrical magnet apparatus according to claim 1, wherein the cylindrical magnetic flux guide is made of one of iron, its alloy, ferrite for radio frequency and a molding material of ferromagnetic powder.

3. A cylindrical magnet apparatus according to claim 1, wherein and magnets making up the magnetic field sources are magnetized in the directions substantially perpendicular to the flow of the magnetic fluxes in the magnetic field generating space, the magnetic field sources of the magnets at the ends of the cylindrical magnetic yoke being magnetized in opposite directions.

4. A cylindrical magnet apparatus comprising a cylindrical magnetic yoke of ferromagnetic material arranged around a predetermined axis (Z axis), magnetic field sources made up of magnets at the ends of said cylindrical magnetic yoke, a cylindrical magnetic flux guide disposed between the magnetic field sources, and pole pieces provided at said magnetic field sources, wherein an object to be inspected is adapted to be inserted in said magnetic flux guide.

5. A cylindrical magnet apparatus according to claim 4, wherein said pole pieces are cylindrical in shape, and the inner diameter thereof progressively increases toward the magnet center along Z axis.

6. A cylindrical magnet apparatus according to claim 5, wherein said pole pieces have outer ends thereof along Z axis which are tapered in such a manner that the inner diameter thereof is progressively increased outward.

7. A cylindrical permanent magnet apparatus comprising a cylindrical magnetic yoke made of ferromagnetic material, magnetic field sources made of permanent magnetic material in contact with the ends of the cylindrical magnetic yoke, a cylindrical magnetic field generating space passed through the ends and symmetric with respect to the central axis (Z axis) of the section of the cylindrical magnetic yoke, and a cylindrical flux guide of a ferromagnetic material disposed in said cylindrical space, wherein a homogeneous magnetic field is formed inside said magnetic flux guide.

8. A cylindrical permanent magnet apparatus according to claim 7, wherein said magnetic field sources of permanent magnet material, are magnetized in the direction parallel with the flow of the magnetic fluxes in the magnetic field generating space, and the magnetic field sources at the ends of the cylindrical magnetic yoke are magnetized in the same direction.

9. A cylindrical permanent magnet apparatus according to claim 7, wherein those sides of the magnetic field sources which are opposite to the sides thereof in contact with the pole pieces respectively are in contact with the annular magnetic yoke of ferromagnetic material, and the magnetic field sources are disposed in a closed magnetic loop not in direct contact with the surroundings of the magnetic field sources.

10. A cylindrical electromagnet apparatus comprising a cylindrical magnetic yoke made of ferromagnetic material, magnetic flux sources made of coils energized at the ends of the cylindrical magnetic yoke, a cylindrical magnetic field generating space passed through the ends symmetric with respect to the center of the central axis (Z axis) of the section of the cylindrical magnetic yoke, and a cylindrical magnetic flux guide made of ferromagnetic material within said cylindrical magnetic field generating space, wherein a homogeneous magnetic field of uniform intensity is formed inside the magnetic flux guide.

11. A cylindrical electromagnetic apparatus according to claim 10, further comprising cylindrical pole pieces made of ferromagnetic material disposed inside the coils energized for uniforming the magnetic fluxes generated.

12. A cylindrical electromagnetic apparatus according to claim 11, which further comprises annular yoke supported by the cylindrical yoke, said pole pieces making up a magnetic circuit in contact with the annular yoke.

13. A cylindrical electromagnet apparatus according to claim 10, wherein coils are wound around the ferromagnetic poles and current is supplied in said coils thereby to generate magnetic fluxes.

14. A cylindrical magnet apparatus according to claim 1, wherein the magnetic field sources are disposed only adjacent to end portions of the cylindrical magnetic flux guide, the cylindrical magnetic flux guide being a non-permanent magnet member.

15. A cylindrical magnet apparatus according to claim 4, wherein the magnetic field sources are disposed only adjacent to end portions of the cylindrical magnetic flux guide, the cylindrical magnetic flux guide being a non-permanent magnet member.

16. A cylindrical magnet apparatus according to claim 7, wherein the magnetic field sources are disposed onlu adjacent to end portions of the cylindrical magnetic flux guide, the cylindrical magnetic flux guide being a non-permanent magnet member.

17. A cylindrical electromagnetic apparatus according to claim 10, wherein the magnetic flux sources are disposed only adjacent to end portions of the cylindrical magnetic flux guide, the cylindrical magnetic flux guide being a non-permanent magnet member.

* * * * *